United States Patent
Kinoshita et al.

(10) Patent No.: US 6,873,193 B2
(45) Date of Patent: Mar. 29, 2005

(54) TWO-LEVEL SUPPLY VOLTAGE DETECTION CIRCUIT

(75) Inventors: Masayoshi Kinoshita, Osaka (JP); Shiro Sakiyama, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/717,640

(22) Filed: Nov. 21, 2003

(65) Prior Publication Data

US 2004/0113661 A1 Jun. 17, 2004

(30) Foreign Application Priority Data

Dec. 13, 2002 (JP) .......................................... 2002-362875

(51) Int. Cl.[7] .................................................. H03L 7/00

(52) U.S. Cl. .......................................... 327/143; 327/74

(58) Field of Search .............................. 327/63, 64, 65, 327/68, 69, 70, 71, 72, 74, 75, 76, 77, 80, 82, 89, 90, 142, 143

(56) References Cited

U.S. PATENT DOCUMENTS 4,473,759 A * 9/1984 Mahabadi ..................... 327/68
5,642,063 A * 6/1997 Lehikoinen ................... 327/74

FOREIGN PATENT DOCUMENTS

JP 58-168122 A 10/1983

* cited by examiner

Primary Examiner—Jeffrey Zweizig
(74) Attorney, Agent, or Firm—McDermott Will & Emery LLP (57) ABSTRACT

A two-level supply voltage detection circuit includes two power supply detection circuits. One of the power supply detection circuits is provided on the high potential side, and the other is provided on the lower potential side. Each power supply detection circuit outputs a detection signal which is active when the supply voltage is equal to or higher than a reference value. The two-level supply voltage detection circuit outputs an OR logic value of the detection outputs of the power supply detection circuits. Furthermore, the power supply detection circuit on the low voltage side includes a detection operation control circuit. Only when a detection signal output from the power supply detection circuit on the high voltage side is active, the detection operation control circuit turns off the power supply detection circuit on the low voltage side in response to the active detection signal.

13 Claims, 10 Drawing Sheets

TWO-LEVEL SUPPLY VOLTAGE DETECTION CIRCUIT

BACKGROUND OF THE INVENTION

The present invention relates to a detection circuit for detecting the supply voltage value of a single power supply at two levels.

In an arithmetic processing unit which uses a solar battery as a supply voltage source, a malfunction may occur because the solar battery has a small current-carrying capacity and lacks the capacity to supply a constant voltage. Conventionally, for the purpose of preventing occurrence of a malfunction in the arithmetic processing unit, two supply voltage detection circuits are provided for detecting the voltage at two different levels, and the supply voltage is monitored such that a malfunction does not occur in the arithmetic processing unit even when the supply voltage varies. In the case where the supply voltage decreases to a level such that a malfunction may occur, the operation of the arithmetic processing unit is stopped so that the arithmetic processing unit is set in a sleep state. Thereafter, when the supply voltage is recovered, the arithmetic processing unit is switched to the active state to resume its operation. As for an arithmetic processing unit which involves an operation period where arithmetic processing is not performed, the operation state of the arithmetic processing unit is switched between the active state and the sleep state according to the operation status of the arithmetic processing unit, thereby reducing the current consumption by an entire LSI device. The above technique is described in, for example, Japanese Unexamined Patent Publication No. 58-168122.

However, the two supply voltage detection circuits monitor the supply voltage all the time and therefore consume the electric current all the time. In the case where the arithmetic processing unit is set in the sleep state according to detection results of the supply voltage detection circuits such that the current consumption is reduced, the current consumption by the entire LSI device decreases, and accordingly, the proportion of the current consumption by the supply voltage detection circuits to the current consumption by the entire LSI device increases. Thus, the current consumption by the supply voltage detection circuit cannot be ignored.

SUMMARY OF THE INVENTION

An objective of the present invention is to reduce the current consumption by a two-level supply voltage detection circuit including two supply voltage detection circuits which are provided for a single power supply.

Figure 12:
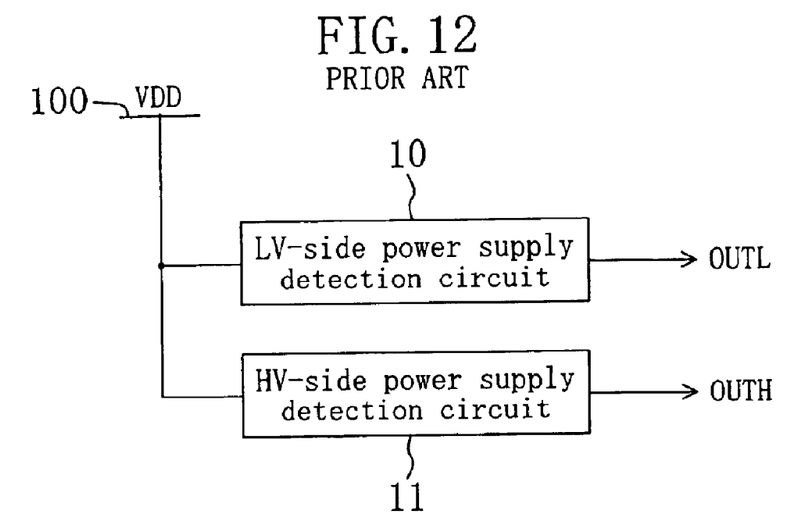
FIG. 12 shows a conventional two-level supply voltage detection circuit.

Hereinafter, the aspects considered by the present inventor(s) are described while referring to a conventional example. FIG. 12 shows a conventional two-level supply voltage detection circuit including two supply voltage detection circuits which are provided for a single power supply. In FIG. 12, reference numeral 10 denotes a low-voltage-side (LV-side) power supply detection circuit, reference numeral 11 denotes a high-voltage-side (HV-side) power supply detection circuit, and reference numeral 100 denotes a power supply which has voltage value VDD. Further, reference mark OUTL denotes a LV-side detection signal which is output from the LV-side power supply detection circuit 10, and reference mark OUTH denotes a HV-side detection signal which is output from the HV-side power supply detection circuit 11.

Figure 13:
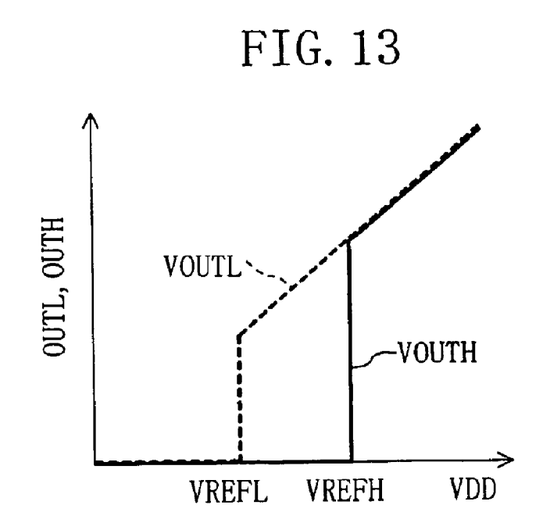
FIG. 13 shows a result of two-level voltage detection performed on the supply voltage.

FIG. 13 shows the relationships of the LV-side detection signal OUTL and the HV-side detection signal OUTH with voltage value VDD of the power supply 100. In FIG. 13, a broken line VOUTL denotes a variation of the LV-side detection signal OUTL over the voltage of the power supply 100, and a solid line VOUTH denotes a variation of the HV-side detection signal OUTH over the voltage of the power supply 100. When voltage value VDD of the power supply 100 is increased to be equal to predetermined reference value VREFL set in the LV-side power supply detection circuit 10, the LV-side detection signal OUTL is activated, i.e., increased from the ground potential to potential VDD of the power supply 100 (in this case, potential VREFL). When voltage value VDD of the power supply 100 is increased to be equal to predetermined reference value VREFH set in the HV-side power supply detection circuit 11, the HV-side detection signal OUTH is activated, i.e., increased from the ground potential to potential VDD of the power supply 100 (in this case, potential VREFH). Herein, it is seen that, when the HV-side detection signal OUTH is activated to be equal to potential VDD of the power supply 100, the LV-side detection signal OUTL is always activated to be equal to potential VDD of the power supply 100.

According to the present invention, for the purpose of achieving the above objective, the LV-side detection signal OUTL is forcedly fixed at potential VDD of the power supply 100 when the HV-side detection signal OUTH is active, and the operation of the LV-side power supply detection circuit 10 is stopped while keeping the HV-side detection signal OUTH active, whereby the current consumption by the LV-side power supply detection circuit 10 is reduced.

Specifically, a two-level supply voltage detection circuit of the present invention comprises: a LV-side power supply detection circuit connected to a HV-side power supply, the LV-side power supply detection circuit outputting a first signal which is active when a voltage input from the HV-side power supply has a value equal to or higher than a LV-side reference value; a HV-side power supply detection circuit connected to the HV-side power supply, the HV-side power supply detection circuit outputting a second signal which is active when a voltage input from the HV-side power supply has a value equal to or higher than a HV-side reference value that is higher than the LV-side reference value; detection operation control means which receives the second signal from the HV-side power supply detection circuit and inactivates the operation of the LV-side power supply detection circuit when the second signal is active; and LV-side power supply detection output fixing means which receives the second signal and outputs an active third signal as a signal corresponding to the first signal when the second signal is active.

In the two-level supply voltage detection circuit of the present invention, the LV-side power supply detection output fixing means is a logic circuit which receives the first signal and the second signal and outputs an active third signal when at least one of the first signal and the second signal is active.

In the two-level supply voltage detection circuit of the present invention, the LV-side power supply detection output fixing means includes a resistor and a first switch which are connected in series between a signal output terminal of the LV-side power supply detection circuit and the HV-side power supply; and the first switch receives the second signal and is turned on only when the second signal is active.

In the two-level supply voltage detection circuit of the present invention, the detection operation control means includes a second switch inserted between the HV-side power supply and the LV-side power supply detection circuit; and the second switch receives the second signal and is turned on only when the second signal is inactive.

In the two-level supply voltage detection circuit of the present invention, the detection operation control means includes a second switch inserted between a LV-side power supply and the LV-side power supply detection circuit; and the second switch receives the second signal and is turned on only when the second signal is inactive.

In the two-level supply voltage detection circuit of the present invention, the LV-side power supply detection circuit includes a reference voltage circuit for outputting a signal having a constant voltage regardless of the voltage of the HV-side power supply, a LV-side supply voltage divider circuit for dividing the voltage of the HV-side power supply and outputting the divided voltage, and a LV-side comparator circuit which receives the output signal from the reference voltage circuit and an output signal from a voltage dividing point of the LV-side supply voltage divider circuit and outputs a first signal which is active only when the level of the output signal from the voltage dividing point of the LV-side supply voltage divider circuit is higher than the level of the output signal from the reference voltage circuit; the HV-side power supply detection circuit includes a HV-side supply voltage divider circuit for dividing the voltage of the HV-side power supply at a dividing ratio such that the HV-side supply voltage divider circuit outputs a voltage lower than the output voltage of the LV-side supply voltage divider circuit, and a HV-side comparator circuit which receives the output signal from the reference voltage circuit and an output signal from a voltage dividing point of the HV-side supply voltage divider circuit and outputs a second signal which is active only when the level of the output signal from the voltage dividing point of the HV-side supply voltage divider circuit is higher than the level of the output signal from the reference voltage circuit; and the detection operation control means inactivates at least one of the LV-side supply voltage divider circuit and the LV-side comparator circuit when the second signal is active.

In the two-level supply voltage detection circuit of the present invention, the detection operation control means includes a second switch inserted between the HV-side power supply and the LV-side power supply detection circuit; and the second switch receives the second signal and is turned on only when the second signal is inactive.

In the two-level supply voltage detection circuit of the present invention, the detection operation control means includes a second switch inserted between the LV-side power supply and the LV-side power supply detection circuit; and the second switch receives the second signal and is turned on only when the second signal is inactive.

In the two-level supply voltage detection circuit of the present invention, the LV-side supply voltage divider circuit includes a first group of resistors provided between the HV-side power supply and the LV-side power supply; and the HV-side supply voltage divider circuit includes a second group of resistors provided between the HV-side power supply and the LV-side power supply.

In the two-level supply voltage detection circuit of the present invention, the total resistance value of the first resistor group is smaller than that of the second resistor group.

In the two-level supply voltage detection circuit of the present invention, the detection operation control means includes a third switch inserted between the first resistor group of the LV-side supply voltage divider circuit and the LV-side power supply; and the third switch receives the second signal and is turned on only when the second signal is inactive.

In the two-level supply voltage detection circuit of the present invention, the total resistance value of the first resistor group is smaller than that of the second resistor group.

In the two-level supply voltage detection circuit of the present invention, the third switch is an NMOS transistor.

As described above, according to the present invention, in the two-level supply voltage detection circuit for detecting the supply voltage of a single power supply at two levels, when an output signal of the HV-side power supply detection circuit for detecting the supply voltage on the high potential side is activated, the LV-side power supply detection output fixing means outputs a third signal in place of a first signal derived from the LV-side power supply detection circuit, and the detection operation control means stops the power supply detection operation of the LV-side power supply detection circuit, based on the activated signal. Thus, the current consumption by the two-level supply voltage detection circuit is reduced.

Furthermore, according to the present invention, the electric current flowing through the LV-side supply voltage divider circuit is interrupted by opening the second switch when the second signal is activated. As a result, the resistance value of the first resistor group of the LV-side supply voltage divider circuit, in which the power consumption is saved, may be smaller than the total resistance value of the second resistor group of the HV-side supply voltage divider circuit which is in operation all the time. Thus, the layout area of a resistive element can be reduced, and accordingly, the layout area of the entire two-level supply voltage detection circuit can be reduced.

According to the present invention, when the third switch is off, the voltage at the voltage dividing point of the first resistor group of the LV-side supply voltage divider circuit is pulled up to the voltage of the HV-side power supply. Therefore, it is not necessary to provide LV-side power supply detection output fixing means independently of the LV-side power supply detection circuit and the HV-side power supply detection circuit because a portion of the first resistor group included in the LV-side power supply detection circuit also functions as LV-side power supply detection output fixing means to fix the first signal of the two-level supply voltage detection circuit at a high level. Thus, the area occupied by the two-level supply voltage detection circuit and the electric power consumed by the two-level supply voltage detection circuit can be further reduced.

According to the present invention, a large gate-source voltage can be obtained by forming the third switch of an NMOS transistor, i.e., connecting the source of the transistor to the ground. Accordingly, the drain-source resistance of the third switch is decreased, and an error in the detection voltage is decreased.

DESCRIPTION OF THE PREFERRED EMBODIMENTS

Hereinafter, two-level supply voltage detection circuits according to embodiments of the present invention are described with reference to the drawings.

Embodiment 1

Figure 1:
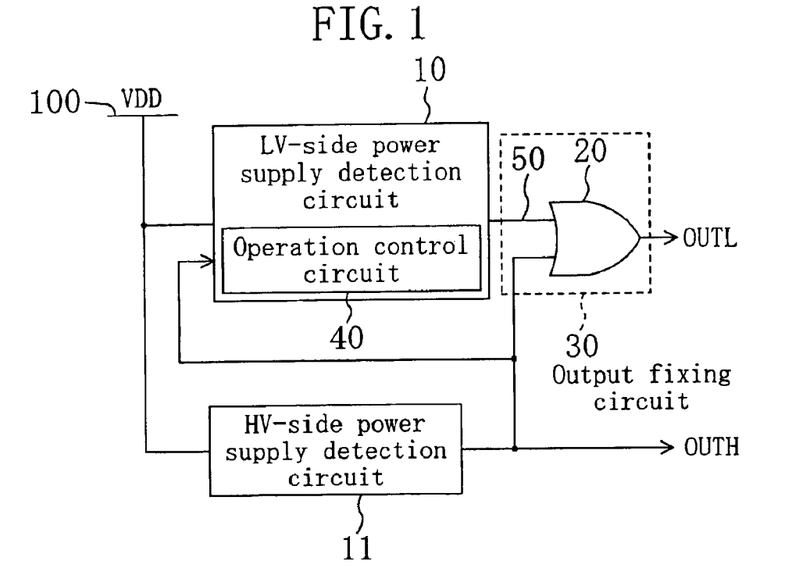
FIG. 1 shows a structure of a two-level supply voltage detection circuit according to embodiment 1 of the present invention.

FIG. 1 is a circuit diagram of a two-level supply voltage detection circuit according to embodiment 1. In the two-level supply voltage detection circuit of FIG. 1, reference numeral 10 denotes a power supply detection circuit on the low voltage side (hereinafter, referred to as "LV-side power supply detection circuit 10"); reference numeral 11 denotes a power supply detection circuit on the high voltage side (hereinafter, referred to as "HV-side power supply detection circuit 11"); reference numeral 30 denotes an output fixing circuit (LV-side power supply detection output fixing means); reference numeral 40 denotes an operation control circuit (detection operation control means); reference numeral 50 denotes a low-voltage-side (LV-side) detection signal which is an output signal of the LV-side power supply detection circuit 10, reference numeral 100 denotes a power supply (high-voltage-side (HV-side) power supply) having voltage value VDD, reference mark OUTH denotes a high-voltage-side (HV-side) detection signal (second signal) which is an output signal of the HV-side power supply detection circuit 11; and reference mark OUTL denotes a low-voltage-side (LV-side) detection signal (third signal) which is output from the output fixing circuit 30.

The two-level supply voltage detection circuit of embodiment 1 includes the LV-side power supply detection circuit 10, the HV-side power supply detection circuit 11, the output fixing circuit 30, and the operation control circuit 40. In embodiment 1, the output fixing circuit 30 includes an OR logic circuit 20.

The LV-side power supply detection circuit 10 has predetermined lower-voltage-side (LV-side) reference value VREFL and compares LV-side reference value VREFL and voltage value VDD of the power supply 100. If voltage value VDD of the power supply 100 is equal to or greater than LV-side reference value VREFL, the LV-side detection signal (first signal) 50 output from the LV-side power supply detection circuit 10 is active. Also in the HV-side power supply detection circuit 11, if voltage value VDD of the power supply 100 is equal to or greater than HV-side reference value VREFH of the HV-side power supply detection circuit 11, the HV-side detection signal OUTH output from the HV-side power supply detection circuit 11 is active.

The LV-side power supply detection circuit 10 includes the operation control circuit 40 which is controlled based on the HV-side detection signal OUTH output from the HV-side power supply detection circuit 11. When the HV-side detection signal OUTH output from the HV-side power supply detection circuit 11 is active, the operation control circuit 40 stops the operation of the LV-side power supply detection circuit 10 such that the current consumption by the LV-side power supply detection circuit 10 is eliminated. When the HV-side detection signal OUTH is inactive, the operation control circuit 40 does not inhibit the detection operation of the LV-side power supply detection circuit 10.

The HV-side detection signal OUTH is also input to the OR logic circuit 20 together with the output signal 50 of the LV-side power supply detection circuit 10. The OR logic circuit 20 outputs a LV-side detection signal OUTL based on the OR logic. That is, when at least one active signal (i.e., a signal having a potential equal to potential VDD of the power supply 100) is input to the OR logic circuit 20, the output of the OR logic circuit 20 is fixed at voltage VDD of the power supply 100, i.e., the LV-side detection signal OUTL output from the OR logic circuit 20 is active.

Next, the operation of the two-level supply voltage detection circuit of embodiment 1 is described. Herein, the description is given for each of the cases sorted according to the relationship between voltage value VDD of the power supply 100 and LV-side reference value VREFL and the relationship between voltage value VDD of the power supply 100 and HV-side reference value VREFH. It should be noted that, in embodiments 1–11, LV-side reference value VREFL is lower than HV-side reference value VREFH.

In the first place, a case where voltage value VDD of the power supply 100 is lower than LV-side reference value VREFL is described. In this case, the HV-side power supply detection circuit 11 detects that voltage value VDD of the power supply 100 is lower than HV-side reference value VREFH, and outputs an inactive signal (a signal having a potential equal to the ground potential). Thus, the operation control circuit 40 of the LV-side power supply detection circuit 10 does not inhibit the operation of the LV-side power supply detection circuit 10. The LV-side power supply detection circuit 10 detects that voltage value VDD of the power supply 100 is lower than LV-side reference value VREFL, and outputs an inactive signal. That is, the signals input to the OR logic circuit 20 are both inactive, and therefore, the LV-side detection signal OUTL results in an inactive signal. In this case, the current consumption by the two-level supply voltage detection circuit is the sum of the current consumption by the LV-side power supply detection circuit 10 and the current consumption by the HV-side power supply detection circuit 11.

Next, a case where voltage value VDD of the power supply 100 is higher than LV-side reference value VREFL and lower than HV-side reference value VREFH is described. In this case, the HV-side power supply detection circuit 11 detects that voltage value VDD of the power supply 100 is lower than HV-side reference value VREFH, and outputs an inactive signal. Thus, the operation control circuit 40 of the LV-side power supply detection circuit 10 allows the operation of the LV-side power supply detection circuit 10. The LV-side power supply detection circuit 10 detects that voltage value VDD of the power supply 100 is higher than LV-side reference value VREFL, and outputs an active signal. That is, the inactive signal and the active signal are input to the OR logic circuit 20, and therefore, the LV-side detection signal OUTL results in an active signal. Also in this case, the current consumption by the two-level supply voltage detection circuit is the sum of the current consumption by the LV-side power supply detection circuit 10 and the current consumption by the HV-side power supply detection circuit 11.

Next, a case where voltage value VDD of the power supply 100 is higher than HV-side reference value VREFH is described. In this case, the HV-side power supply detection circuit 11 outputs an active signal. Thus, the LV-side power supply detection circuit 10 receives the active signal from the HV-side power supply detection circuit 11, and the operation control circuit 40 of the LV-side power supply detection circuit 10 stops the operation of the LV-side power supply detection circuit 10, so that the output signal of the LV-side power supply detection circuit 10 becomes indefinite. However, since the OR logic circuit 20 receives the active signal from the HV-side power supply detection circuit 11, the LV-side detection signal OUTL results in an active signal. In this case, the operation of the LV-side power supply detection circuit 10 is stopped, and the electric current is consumed only by the HV-side power supply detection circuit 11. That is, the current consumption by the entire two-level supply voltage detection circuit is effectively reduced. For example, in a system including the above two-level supply voltage detection circuit of the present invention, an arithmetic processing unit and other circuits, when both the output signals OUTL and OUTH of the two-level supply voltage detection circuit are active, the current consumption by the two-level supply voltage detection circuit during the operation of the system is only the current consumption by the HV-side power supply detection circuit 11. Thus, the current consumption is effectively reduced.

Embodiment 2

Now, embodiment 2 of the present invention is described.

Figure 2:
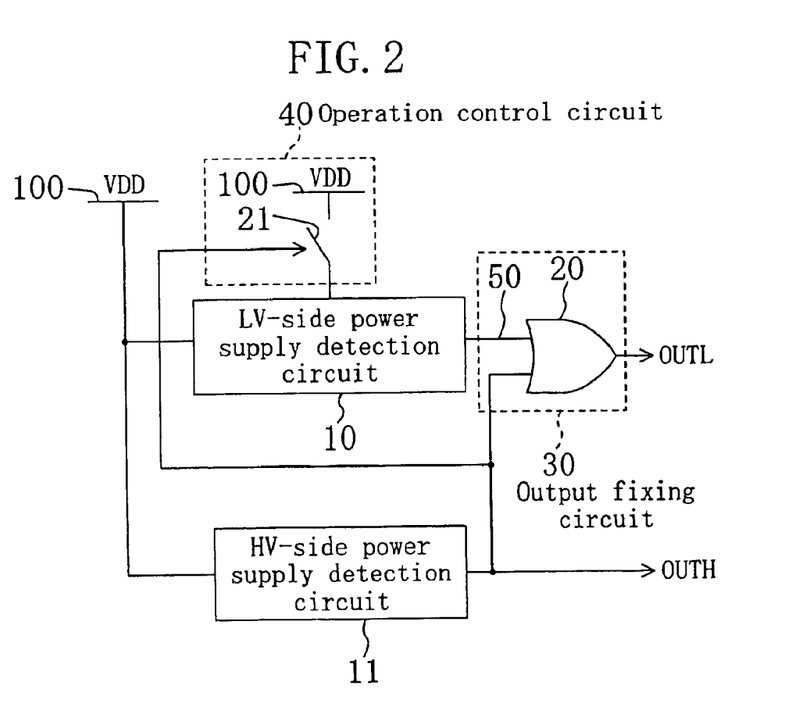
FIG. 2 shows a structure of a two-level supply voltage detection circuit according to embodiment 2 of the present invention.

FIG. 2 is a circuit diagram of a two-level supply voltage detection circuit of embodiment 2. In embodiment 2, the operation control circuit 40 of embodiment 1 shown in FIG. 1 includes a switch 21 (second switch) inserted between the power supply 100 and the LV-side power supply detection circuit 10. The switch 21 receives a HV-side detection signal OUTH. When the received HV-side detection signal OUTH is inactive, the switch 21 is turned on. When the received HV-side detection signal OUTH is active, the switch 21 is turned off. It should be noted that, in embodiments 2 to 11, elements having the same functions are denoted by the same reference numerals used in embodiment 1, and descriptions thereof are herein omitted.

The operation of the two-level supply voltage detection circuit of embodiment 2 is described. Herein also, the description is given for each of the cases sorted according to the relationship between voltage value VDD of the power supply 100 and HV-side reference value VREFH.

In the first place, a case where voltage value VDD of the power supply 100 is lower than HV-side reference value VREFH is described. In this case, the HV-side detection signal OUTH is inactive, and therefore, the switch 21 is turned on, so that the two-level supply voltage detection circuit operates as described in embodiment 1.

Next, a case where voltage value VDD of the power supply 100 is higher than HV-side reference value VREFH is described. In this case, the HV-side detection signal OUTH is active, so that the switch 21 is turned off. As a result, the current consumption by the LV-side power supply detection circuit 10 is eliminated. On the other hand, the signal input to the OR logic circuit 20 from the HV-side power supply detection circuit 11 is active, and accordingly, a LV-side detection signal OUTL becomes active. Thus, the current consumption by the LV-side power supply detection circuit 10 is eliminated, i.e., the total current consumption by the two-level supply voltage detection circuit is reduced to only the current consumption by the HV-side power supply detection circuit 11, while the function of the two-level supply voltage detection circuit is maintained.

Embodiment 3

Now, embodiment 3 of the present invention is described.

Figure 3:
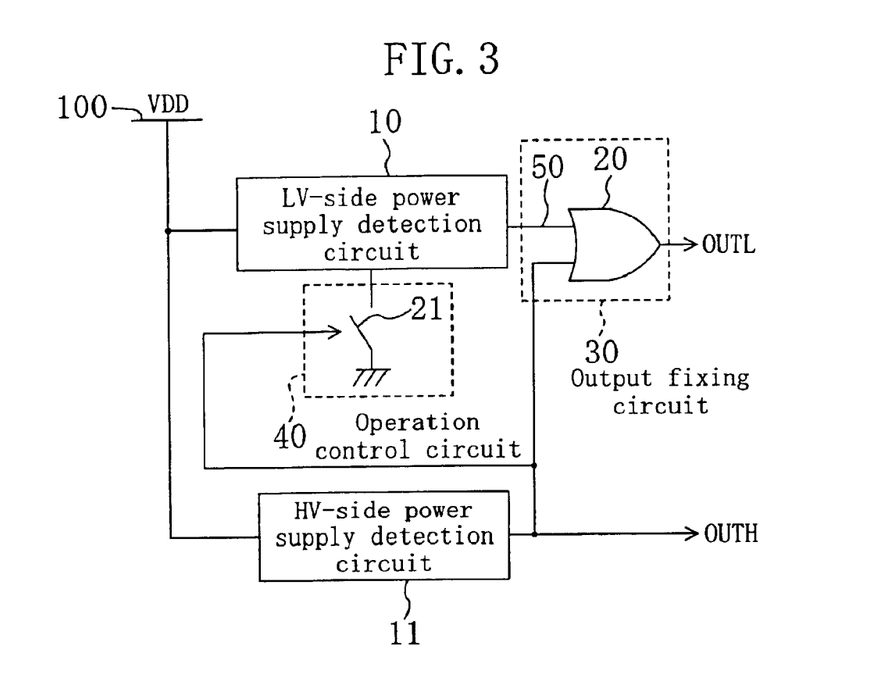
FIG. 3 shows a structure of a two-level supply voltage detection circuit according to embodiment 3 of the present invention.

FIG. 3 is a circuit diagram of a two-level supply voltage detection circuit of embodiment 3. In embodiment 3, the operation control circuit 40 of embodiment 1 shown in FIG. 1 includes a switch 21 inserted between a ground terminal of the LV-side power supply detection circuit 10 and a ground power supply (lower-voltage-side power supply). As described in embodiment 2, the switch 21 receives a HV-side detection signal OUTH and is turned on only when the received HV-side detection signal OUTH is inactive.

The operation of the two-level supply voltage detection circuit of embodiment 3 is described. Herein also, the description is given for each of the cases sorted according to the relationship between voltage value VDD of the power supply 100 and HV-side reference value VREFH.

In the first place, a case where voltage value VDD of the power supply 100 is lower than HV-side reference value VREFH is described. In this case, the HV-side detection signal OUTH is inactive, and therefore, the switch 21 is turned on, so that the two-level supply voltage detection circuit operates as described in embodiment 1. Thus, the operation of the LV-side power supply detection circuit 10 is not restricted. The electric current is consumed by both the LV-side power supply detection circuit 10 and the HV-side power supply detection circuit 11.

Next, a case where voltage value VDD of the power supply 100 is higher than HV-side reference value VREFH is described. In this case, the HV-side detection signal OUTH is active, so that the switch 21 is turned off. As a result, the current consumption by the LV-side power supply detection circuit 10 is eliminated. On the other hand, the signal input to the OR logic circuit 20 from the HV-side power supply detection circuit 11 is active, and accordingly, a LV-side detection signal OUTL becomes active. Thus, the current consumption by the LV-side power supply detection circuit 10 is eliminated, i.e., the total current consumption by the two-level supply voltage detection circuit is reduced to only the current consumption by the HV-side power supply detection circuit 11, while the function of the two-level supply voltage detection circuit is maintained.

Embodiment 4

Now, embodiment 4 of the present invention is described.

Figure 4:
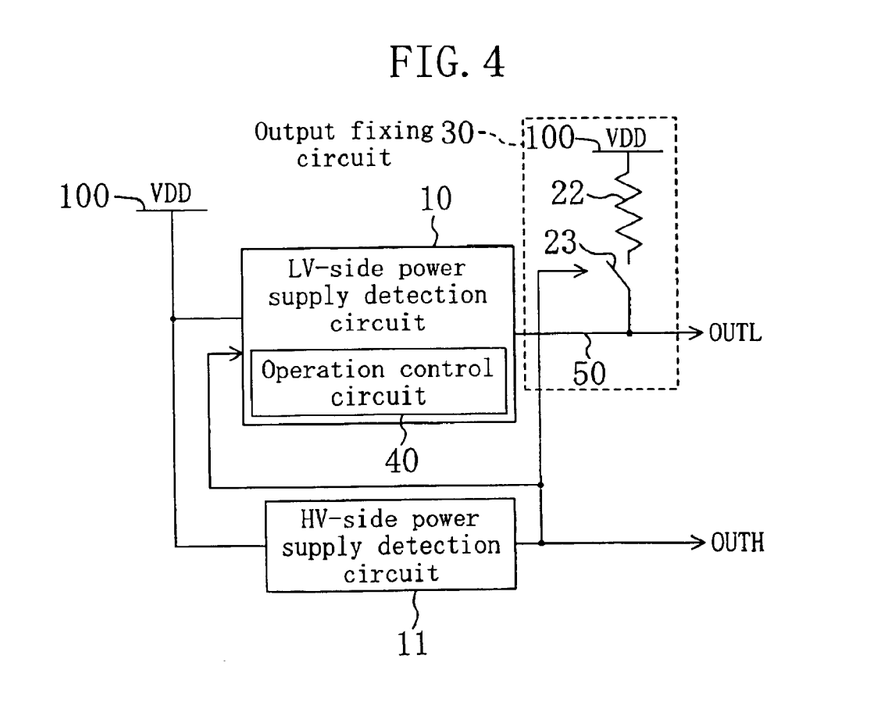
FIG. 4 shows a structure of a two-level supply voltage detection circuit according to embodiment 4 of the present invention.

FIG. 4 is a circuit diagram of a two-level supply voltage detection circuit of embodiment 4. In embodiment 4, the output fixing circuit 30 of embodiment 1 shown in FIG. 1, which includes the OR logic circuit 20, is formed instead by a resistor 22 and a switch (first switch) 23 which are connected in series between the power supply 100 and a signal output terminal of the LV-side power supply detection circuit 10. The switch 23 receives the HV-side detection signal OUTH. When the HV-side detection signal OUTH is active, the switch 23 is turned on. When the HV-side detection signal OUTH is inactive, the switch 23 is turned off. Thus, when the HV-side detection signal OUTH is active, the potential of a LV-side detection signal OUTL is pulled up to, and fixed at, voltage VDD of the power supply 100.

In embodiment 4, the structures and operations of the LV-side power supply detection circuit 10 and the HV-side power supply detection circuit 11 are the same as those of embodiment 1, and therefore, descriptions thereof are herein omitted.

When voltage value VDD of the power supply 100 is lower than HV-side reference value VREFH, the electric current is consumed by both the LV-side power supply detection circuit 10 and the HV-side power supply detection circuit 11. On the other hand, when voltage value VDD of the power supply 100 is higher than HV-side reference value VREFH, the operation control circuit 40 stops the operation of the LV-side power supply detection circuit 10 according to the HV-side detection signal OUTH. As a result, the total current consumption by the two-level supply voltage detection circuit is reduced to only the current consumption by the HV-side power supply detection circuit 11.

Embodiment 5

Now, embodiment 5 of the present invention is described.

Figure 5:
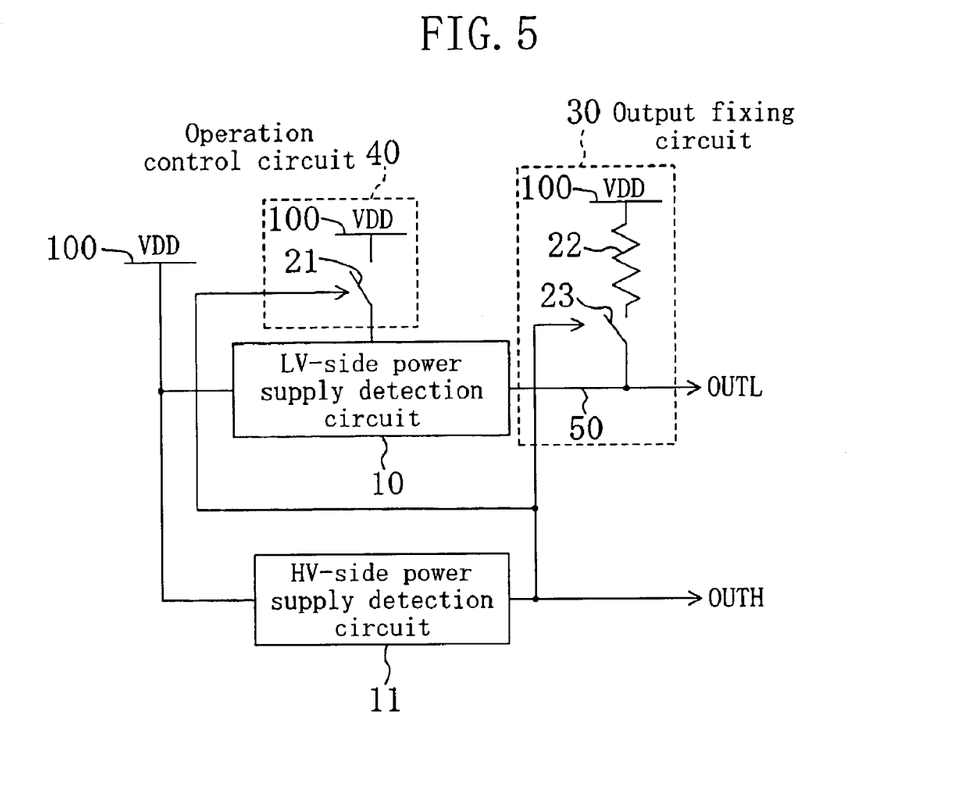
FIG. 5 shows a structure of a two-level supply voltage detection circuit according to embodiment 5 of the present invention.

FIG. 5 is a circuit diagram of a two-level supply voltage detection circuit of embodiment 5. In embodiment 5, the operation control circuit 40 of embodiment 4 shown in FIG. 4 includes a switch 21 inserted between the power supply 100 and the LV-side power supply detection circuit 10. As described in embodiments 2 and 3, the switch 21 receives the HV-side detection signal OUTH and is turned off only when the received HV-side detection signal OUTH is active.

The operation of the two-level supply voltage detection circuit of embodiment 5 is described. Herein also, the description is given for each of the cases sorted according to the relationship between voltage value VDD of the power supply 100 and HV-side reference value VREFH.

In the first place, a case where voltage value VDD of the power supply 100 is lower than HV-side reference value VREFH is described. In this case, the HV-side detection signal OUTH is inactive, and therefore, the switch 21 is turned on, so that the two-level supply voltage detection circuit operates as described in embodiment 4. That is, the operation of the LV-side power supply detection circuit 10 is not restricted. The electric current is consumed by both the LV-side power supply detection circuit 10 and the HV-side power supply detection circuit 11.

Next, a case where voltage value VDD of the power supply 100 is higher than HV-side reference value VREFH is described. In this case, the HV-side detection signal OUTH is active, so that the switch 21 is turned off. As a result, the current consumption by the LV-side power supply detection circuit 10 is eliminated. On the other hand, since the HV-side detection signal OUTH output from the HV-side power supply detection circuit 11 is active, the switch 23 of the output fixing circuit 30 is turned on, and the potential of a LV-side detection signal OUTL is pulled up to voltage VDD of the power supply 100 so as to be in an active state. Thus, the current consumption by the LV-side power supply detection circuit 10 is eliminated, i.e., the total current consumption by the two-level supply voltage detection circuit is reduced to only the current consumption by the HV-side power supply detection circuit 11, while the function of the two-level supply voltage detection circuit is maintained.

Embodiment 6

Now, embodiment 6 of the present invention is described.

Figure 6:
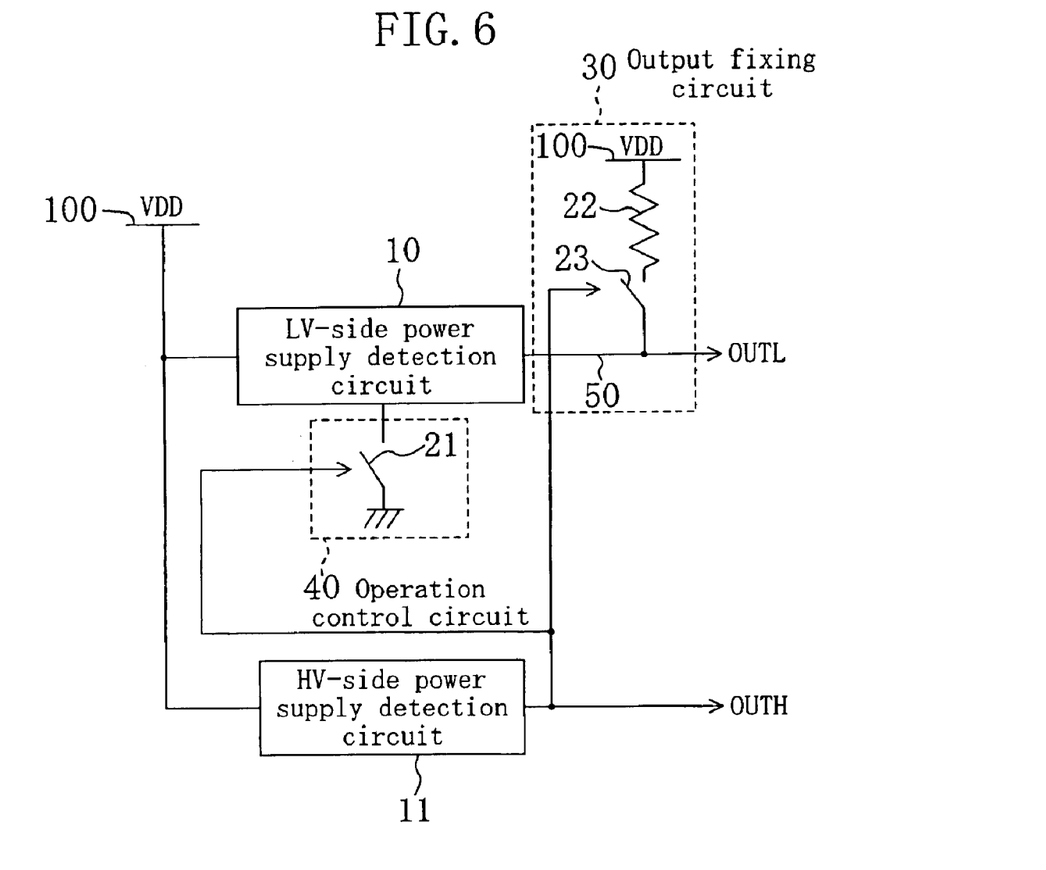
FIG. 6 shows a structure of a two-level supply voltage detection circuit according to embodiment 6 of the present invention.

FIG. 6 is a circuit diagram of a two-level supply voltage detection circuit of embodiment 6. In embodiment 6, the operation control circuit 40 of embodiment 4 shown in FIG. 4 includes a switch 21 inserted between a ground terminal of the LV-side power supply detection circuit 10 and a ground power supply. As described in embodiments 2, 3, and 5, the switch 21 receives the HV-side detection signal OUTH and is turned off only when the received HV-side detection signal OUTH is active.

The operation of the two-level supply voltage detection circuit of embodiment 6 is described. Herein also, the description is given for each of the cases sorted according to the relationship between voltage value VDD of the power supply 100 and HV-side reference value VREFH.

In the first place, a case where voltage value VDD of the power supply 100 is lower than HV-side reference value VREFH is described. In this case, the HV-side detection signal OUTH is inactive, and therefore, the switch 21 is turned on, so that the two-level supply voltage detection circuit operates as described in embodiment 4. Thus, the operation of the LV-side power supply detection circuit 10 is not restricted. The electric current is consumed by both the LV-side power supply detection circuit 10 and the HV-side power supply detection circuit 11.

Next, a case where voltage value VDD of the power supply 100 is higher than HV-side reference value VREFH is described. In this case, the HV-side detection signal OUTH is active, so that the switch 21 is turned off. As a result, the current consumption by the LV-side power supply detection circuit 10 is eliminated. On the other hand, since the HV-side detection signal OUTH output from the HV-side power supply detection circuit 11 is active, the switch 23 is turned on, and the potential of a LV-side detection signal OUTL is pulled up to voltage VDD of the power supply 100 so as to be in an active state. Thus, the current consumption by the LV-side power supply detection circuit 10 is eliminated, i.e., the total current consumption by the two-level supply voltage detection circuit is reduced to only the current consumption by the HV-side power supply detection circuit 11, while the function of the two-level supply voltage detection circuit is maintained.

Embodiment 7

Now, embodiment 7 of the present invention is described.

Figure 7:
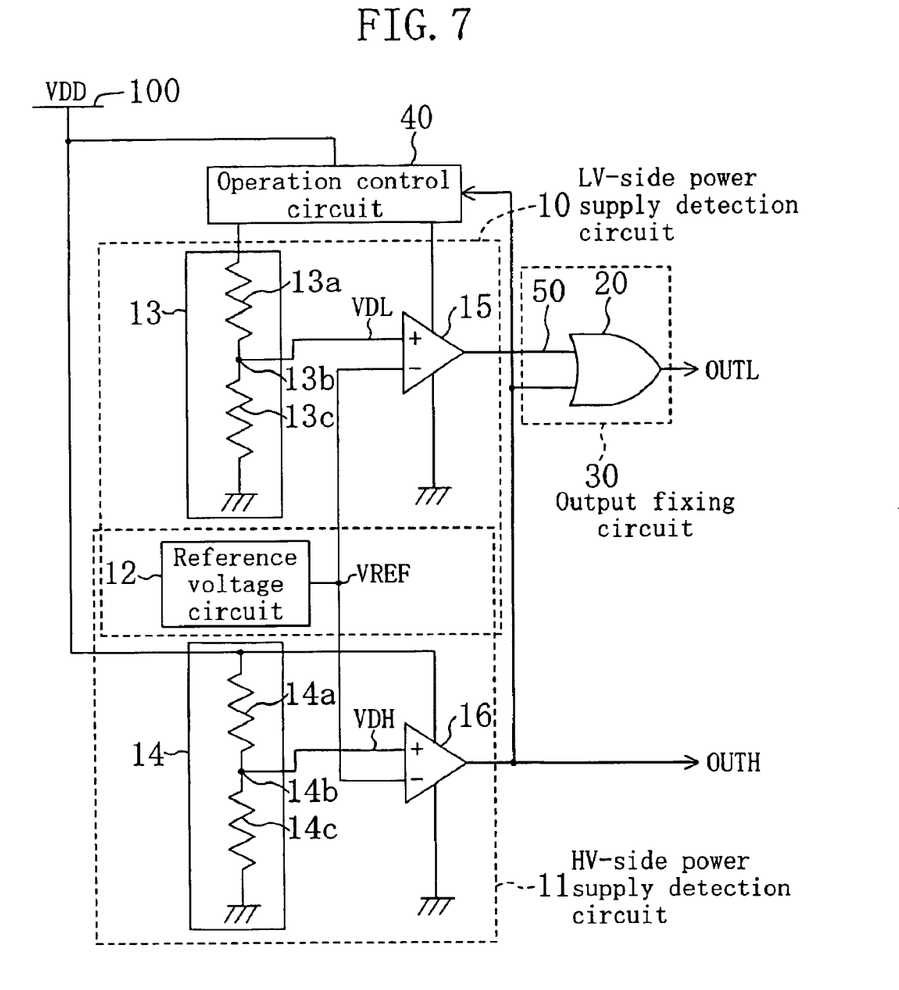
FIG. 7 shows a structure of a two-level supply voltage detection circuit according to embodiment 7 of the present invention.

FIG. 7 is a circuit diagram of a two-level supply voltage detection circuit of embodiment 7. In embodiment 7, the LV-side power supply detection circuit 10 of embodiment 1 shown in FIG. 1 specifically includes a LV-side supply voltage divider circuit 13 which divides the voltage between the power supply 100 and the ground power supply, a LV-side comparator circuit 15, and a reference voltage circuit 12. The HV-side power supply detection circuit 11 specifically includes a HV-side supply voltage divider circuit 14, a HV-side comparator circuit 16 and the reference voltage circuit 12. In the LV-side power supply detection circuit 10, the operation control circuit 40 is positioned between the power supply 100 and the LV-side supply voltage divider circuit 13 and between the power supply 100 and the LV-side comparator circuit 15.

The reference voltage circuit 12 outputs reference voltage VREF which is constant regardless of the magnitude of voltage VDD of the power supply 100. The reference voltage circuit 12 is shared by the LV-side power supply detection circuit 10 and the HV-side power supply detection circuit 11. Reference voltage VREF output from the reference voltage circuit 12 is supplied to the LV-side power supply detection circuit 10 and the HV-side power supply detection circuit 11.

The LV-side supply voltage divider circuit 13 includes two resistors 13a and 13c. The LV-side supply voltage divider circuit 13 divides the potential difference between the voltage of the HV-side power supply 100 and the ground potential by the resistors 13a and 13c, and outputs an output signal VDL from a voltage dividing point 13b of the LV-side supply voltage divider circuit 13. The HV-side supply voltage divider circuit 14 also includes two resistors 14a and 14c and a voltage dividing point 14b as shown in FIG. 7. The HV-side supply voltage divider circuit 14 functions in the same manner as the LV-side supply voltage divider circuit 13, and outputs an output signal VDH from the voltage dividing point 14b. When voltage VDD of the power supply 100 is increased to a level equal to predetermined LV-side reference value VREFL, the LV-side supply voltage divider circuit 13 divides voltage VDD using the resistors such that the output signal VDL is higher than reference voltage VREF. Also in the HV-side supply voltage divider circuit 14, voltage VDD of the power supply 100 is increased to a level equal to predetermined HV-side reference value VREFH, the HV-side supply voltage divider circuit 14 divides voltage VDD using the resistors such that the output signal VDH is higher than reference voltage VREF.

In each of the LV-side power supply detection circuit 10 and the HV-side power supply detection circuit 11, the comparator circuit (15, 16) compares the output signal (VDL, VDH) from the voltage dividing point (13b, 14b) of the supply voltage divider circuit (13, 14) with reference voltage VREF. If the output signal (VDL, VDH) is higher than reference voltage VREF, the comparator circuit (15, 16) outputs an active signal. If the output signal (VDL, VDH) is lower than reference voltage VREF, the comparator circuit (15, 16) outputs an inactive signal. That is, signals output from the comparator circuits 15 and 16 are output signals of the LV-side power supply detection circuit 10 and the HV-side power supply detection circuit 11, respectively.

The operation control circuit 40 receives the HV-side detection signal OUTH. When the HV-side detection signal OUTH is active, the operation control circuit 40 stops the supply of electric current from the power supply 100 to the LV-side supply voltage divider circuit 13 and the LV-side comparator circuit 15.

The output signals of the LV-side comparator circuit 15 and the HV-side comparator circuit 16 are input to the OR logic circuit 20 of the output fixing circuit 30. The OR logic circuit 20 outputs a LV-side detection signal OUTL based on the OR logic.

The operation of the two-level supply voltage detection circuit of embodiment 7 is described. Herein also, the description is given for each of the cases sorted according to the relationship between voltage value VDD of the power supply 100 and LV-side reference value VREFL and the relationship between voltage value VDD of the power supply 100 and HV-side reference value VREFH.

In the first place, a case where voltage value VDD of the power supply 100 is lower than LV-side reference value VREFL is described. In this case, the output signal VDH is lower than reference voltage VREF (VDH<VREF), and accordingly, the HV-side detection signal OUTH output from the HV-side comparator circuit 16 becomes inactive. In this state, the operation control circuit 40 allows the supply of power to the LV-side supply voltage divider circuit 13 and the LV-side comparator circuit 15, thereby allowing the operation of these circuits. Since the output signal VDL of the LV-side supply voltage divider circuit 13 is lower than reference voltage VREF (VDL<VREF), the signal 50 output from the LV-side comparator circuit 15 is inactive. Thus, the signals input to the OR logic circuit 20 are all inactive, and therefore, the LV-side detection signal OUTL becomes inactive. Under such circumstances, in the two-level supply voltage detection circuit, the electric current is consumed by the reference voltage circuit 12, the two supply voltage divider circuits 13 and 14, and the two comparator circuits 15 and 16.

Next, a case where voltage value VDD of the power supply 100 is higher than LV-side reference value VREFL and lower than HV-side reference value VREFH is described. Also in this case, the output signal VDH is lower than reference voltage VREF (VDH<VREF), and accordingly, the HV-side detection signal OUTH output from the HV-side comparator circuit 16 is inactive. In this state, the operation control circuit 40 allows the supply of power to the LV-side supply voltage divider circuit 13 and the LV-side comparator circuit 15, thereby allowing the operation of these circuits. Since the output signal VDL of the LV-side supply voltage divider circuit 13 is higher than reference voltage VREF (VDL>VREF), the signal 50 output from the LV-side comparator circuit 15 is active. Since the LV-side comparator circuit 15 inputs the active signal to the OR logic circuit 20, the LV-side detection signal OUTL becomes active. Under such circumstances also, in the two-level supply voltage detection circuit, the electric current is consumed by the reference voltage circuit 12, the two supply voltage divider circuits 13 and 14, and the two comparator circuits 15 and 16.

Next, a case where voltage value VDD of the power supply 100 is higher than HV-side reference value VREFH is described. In this case, the output signal VDH is higher than reference voltage VREF (VDH>VREF), and accordingly, the HV-side detection signal OUTH output from the HV-side comparator circuit 16 is active. Thus, the operation control circuit 40 stops the supply of electric power to the LV-side supply voltage divider circuit 13 and the LV-side comparator circuit 15, thereby stopping the operation of these circuits. As a result, the output signal of the LV-side comparator circuit 15 becomes inactive. However, the LV-side detection signal OUTL is active because the signal input to the OR logic circuit 20 from the HV-side comparator circuit 16 is active. Under these circumstances, the electric current is consumed only by the reference voltage circuit 12, the HV-side supply voltage divider circuit 14 and the HV-side comparator circuit 16 of the HV-side power supply detection circuit 11. On the other hand, the operation of the LV-side supply voltage divider circuit 13 and the LV-side comparator circuit 15 of the LV-side power supply detection circuit 10 is stopped, and therefore, the electric current is not consumed by these stopped circuits.

For example, consider a system including the above two-level supply voltage detection circuit of the present invention, an arithmetic processing unit and other circuits, wherein the system operates only when both of the output signals of the two-level supply voltage detection circuit, i.e., both the LV-side detection signal OUTL and the HV-side detection signal OUTH, are active. In the two-level supply voltage detection circuit, the electric current is consumed only by the reference voltage circuit 12, the HV-side supply voltage divider circuit 14 and the HV-side comparator circuit 16 of the HV-side power supply detection circuit 11 during the operation of the system, and therefore, the current consumption is reduced.

Furthermore, in an example where the LV-side supply voltage divider circuit 13 and the HV-side supply voltage divider circuit 14 are formed by the resistors as in the present embodiment, the electric current to the LV-side supply voltage divider circuit 13 is interrupted by the operation control circuit 40 when the HV-side detection signal OUTH is active. Thus, due to the saved electric power, the resistance value of the LV-side supply voltage divider circuit 13 may be smaller than the total resistance value of the HV-side supply voltage divider circuit 14 which is in operation all the time. As a result, the size of a resistive element can be reduced, and accordingly, the layout area of the LV-side supply voltage divider circuit 13 can be reduced. Therefore, the layout area of the entire two-level supply voltage detection circuit can also be reduced.

Embodiment 8

Now, embodiment 8 of the present invention is described.

Figure 8:
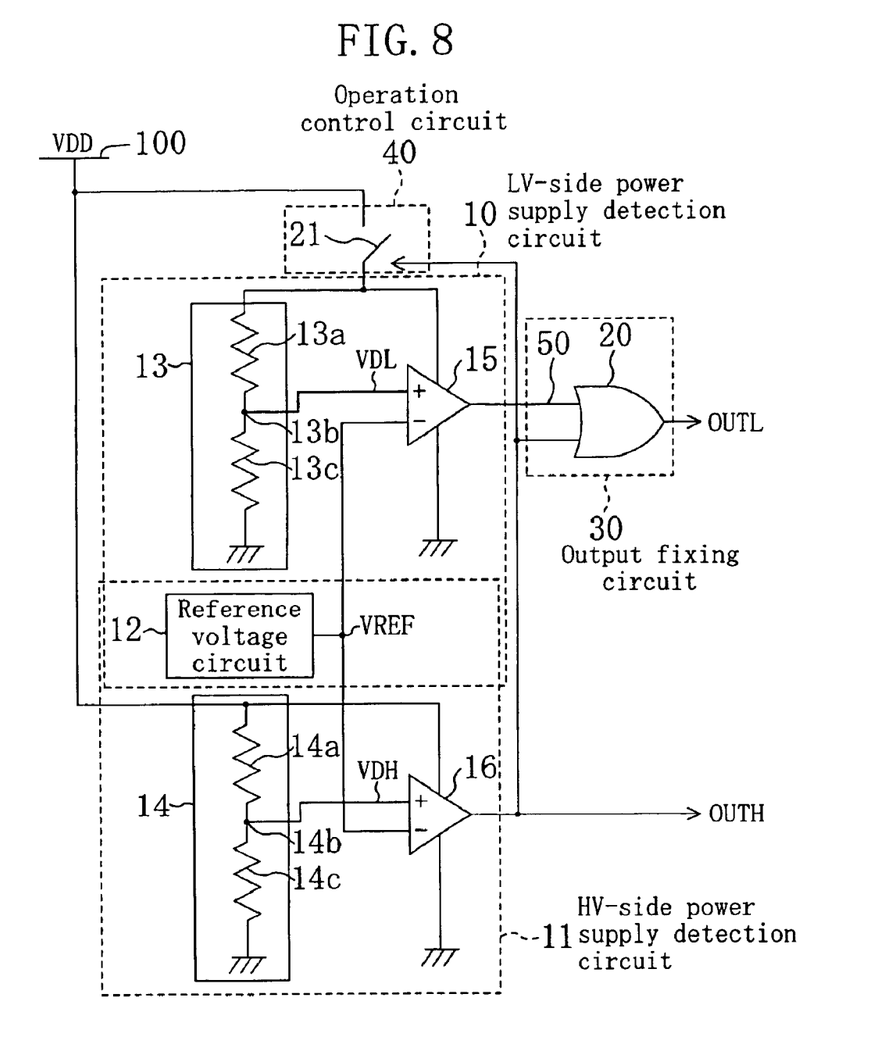
FIG. 8 shows a structure of a two-level supply voltage detection circuit according to embodiment 8 of the present invention.

FIG. 8 is a circuit diagram of a two-level supply voltage detection circuit of embodiment 8. In embodiment 8, the operation control circuit 40 of embodiment 7 shown in FIG. 7 includes a switch 21. The switch 21 is turned on when the HV-side detection signal OUTH is inactive. The switch 21 is turned off when the HV-side detection signal OUTH is active.

The operation of the two-level supply voltage detection circuit of embodiment 8 is now described. When voltage value VDD of the power supply 100 is lower than HV-side reference value VREFH, the HV-side detection signal OUTH is inactive, and accordingly, the switch 21 is turned on, so that the two-level supply voltage detection circuit operates as described in embodiment 7. That is, the electric current is consumed by the reference voltage circuit 12, the two supply voltage divider circuits 13 and 14, and the two comparator circuits 15 and 16.

When voltage value VDD of the power supply 100 is higher than HV-side reference value VREFH, the HV-side detection signal OUTH is active, and accordingly, the switch 21 is turned off. As a result, the current consumption by the LV-side supply voltage divider circuit 13 and the LV-side comparator circuit 15 are eliminated. Further, since the signal input to the OR logic circuit 20 from the HV-side comparator circuit 16 is active, the LV-side detection signal OUTL is an active signal. Thus, the current consumption by the LV-side supply voltage divider circuit 13 and the LV-side comparator circuit 15 is eliminated while the function of the two-level supply voltage detection circuit is maintained.

Alternatively, according to embodiment 8, the switch may be inserted between the LV-side supply voltage divider circuit 13 and the ground power supply and between the LV-side comparator circuit 15 and the ground power supply. In this arrangement, when the HV-side detection signal OUTH is active, the supply of power from the ground power supply to the LV-side supply voltage divider circuit 13 and the LV-side comparator circuit 15 are interrupted. This alternative embodiment corresponds to Claims 5 and 8.

Embodiment 9

Now, embodiment 9 of the present invention is described.

Figure 9:
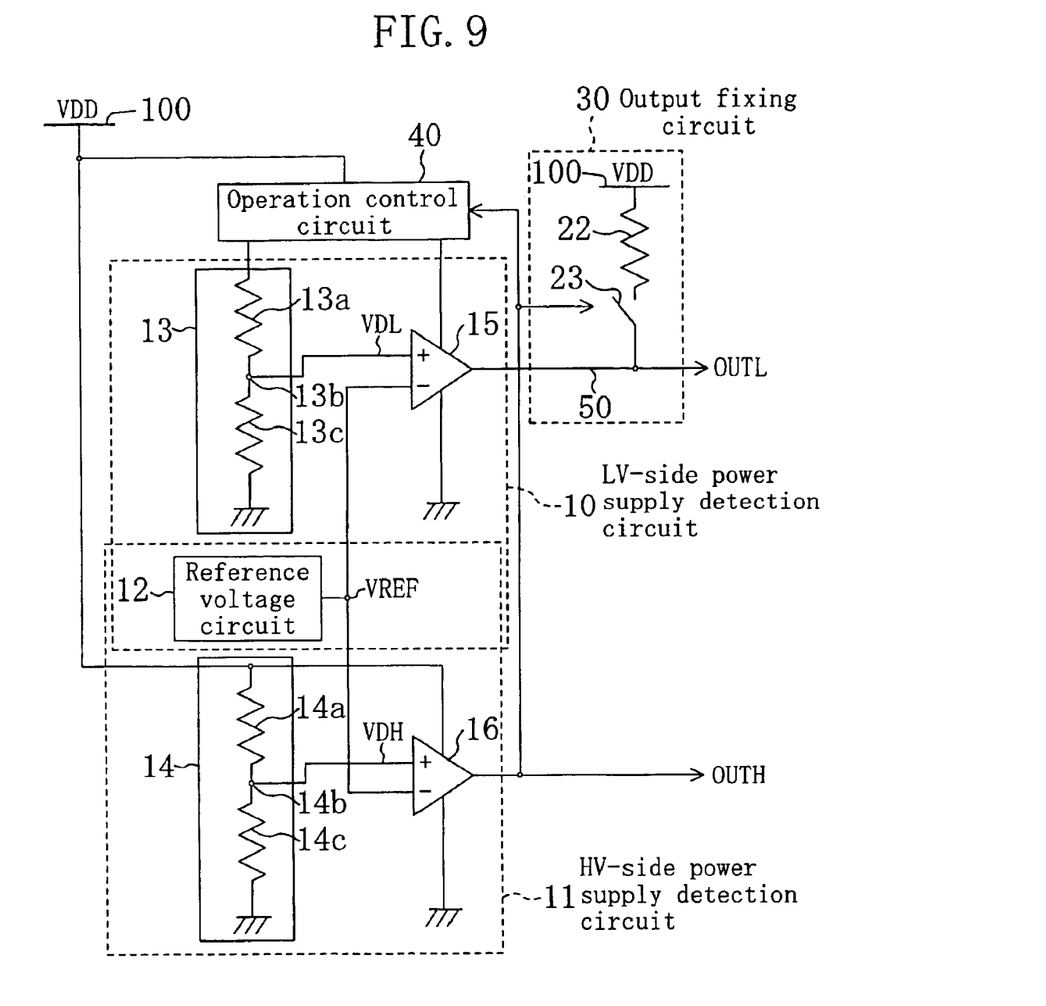
FIG. 9 shows a structure of a two-level supply voltage detection circuit according to embodiment 9 of the present invention.

FIG. 9 is a circuit diagram of a two-level supply voltage detection circuit of embodiment 9. In embodiment 9, the output fixing circuit 30 of embodiment 7 shown in FIG. 7, which is formed by the OR logic circuit 20, is formed instead by a resistor 22 and a switch 23 which are connected in series between the power supply 100 and a signal output terminal of the LV-side power supply detection circuit 10.

In the output fixing circuit 30 of embodiment 9, the switch 23 is turned on when the HV-side detection signal OUTH of the HV-side power supply detection circuit 11 is active. Thus, when the HV-side detection signal OUTH is active, the level of a LV-side detection signal OUTL is pulled up to, and fixed at, voltage VDD of the power supply 100.

The structures of the LV-side power supply detection circuit 10 and the HV-side power supply detection circuit 11 are the same as those of embodiment 7. Thus, when voltage value VDD of the power supply 100 is lower than HV-side reference value VREFH, the electric current is consumed by both the LV-side power supply detection circuit 10 and the HV-side power supply detection circuit 11. On the other hand, when voltage value VDD of the power supply 100 is higher than HV-side reference value VREFH, the operation of the LV-side power supply detection circuit 10 is stopped based on the HV-side detection signal OUTH, and accordingly, the current consumption by the two-level supply voltage detection circuit is reduced to only the current consumption by the HV-side power supply detection circuit 11.

Embodiment 10

Now, embodiment 10 of the present invention is described.

Figure 10:
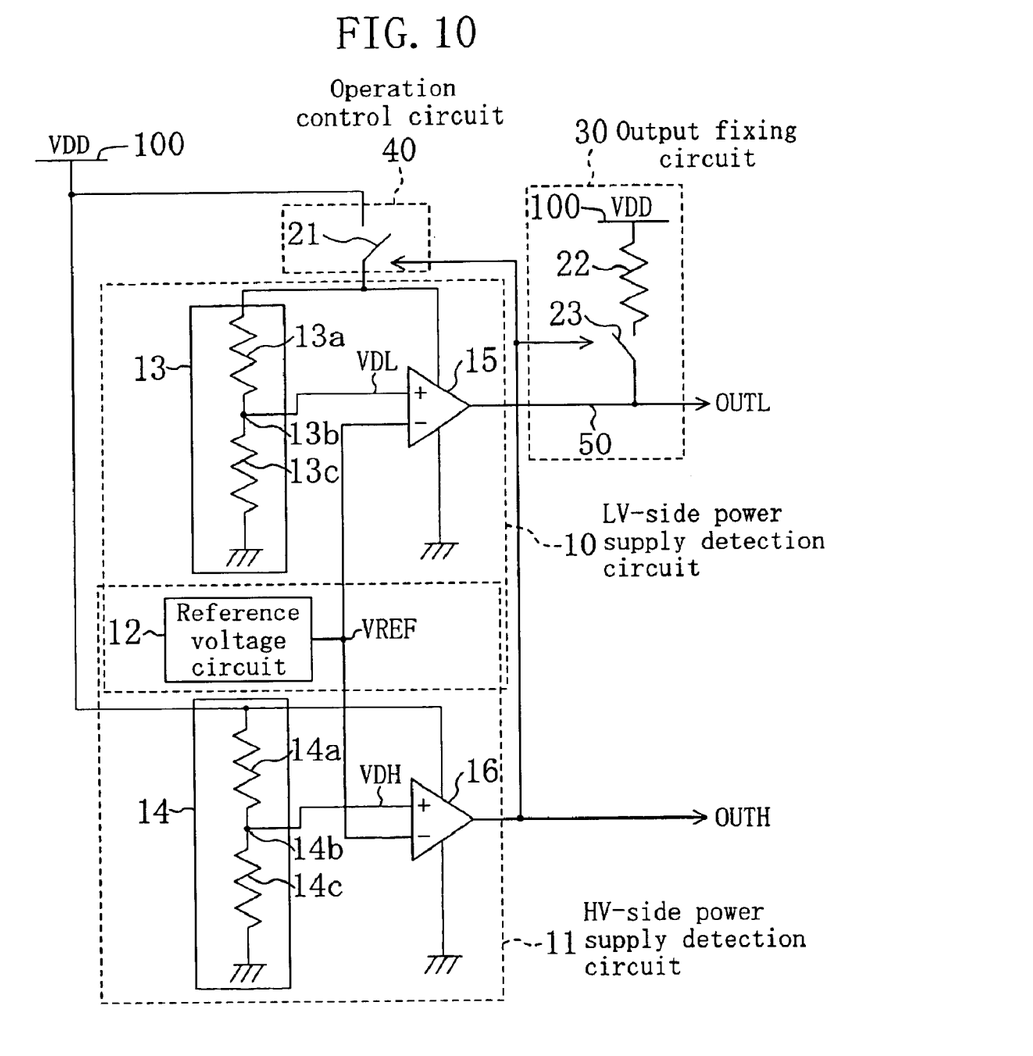
FIG. 10 shows a structure of a two-level supply voltage detection circuit according to embodiment 10 of the present invention.

FIG. 10 is a circuit diagram of a two-level supply voltage detection circuit of embodiment 10. Embodiment 10 corresponds to Claims 3, 6, 7, and 9.

In embodiment 10, the operation control circuit 40 of embodiment 9 shown in FIG. 9 includes a switch 21. The switch 21 is turned on only when the HV-side detection signal OUTH is inactive.

The operation of the two-level supply voltage detection circuit of embodiment 10 is now described. When voltage value VDD of the power supply 100 is lower than HV-side reference value VREFH, the HV-side detection signal OUTH is inactive, and accordingly, the switch 21 is turned on, so that the two-level supply voltage detection circuit operates as described in embodiment 9. That is, the electric current is consumed by the reference voltage circuit 12, the two supply voltage divider circuits 13 and 14, and the two comparator circuits 15 and 16.

When voltage value VDD of the power supply 100 is higher than HV-side reference value VREFH, the HV-side detection signal OUTH is active, and accordingly, the switch 21 is turned off. As a result, the current consumption by the LV-side supply voltage divider circuit 13 and the LV-side comparator circuit 15 is eliminated.

Furthermore, since the HV-side detection signal OUTH output from the HV-side power supply detection circuit 11 is active, the switch 23 of the output fixing circuit 30 is turned on, and the potential of a LV-side detection signal OUTL is pulled up to voltage VDD of the power supply 100 so as to be in an active state. Thus, the current consumption by the LV-side power supply detection circuit 10 is eliminated, i.e., the total current consumption by the two-level supply voltage detection circuit is reduced to only the current consumption by the HV-side power supply detection circuit 11, while the function of the two-level supply voltage detection circuit is maintained.

Embodiment 11

Now, embodiment 11 of the present invention is described.

Figure 11:
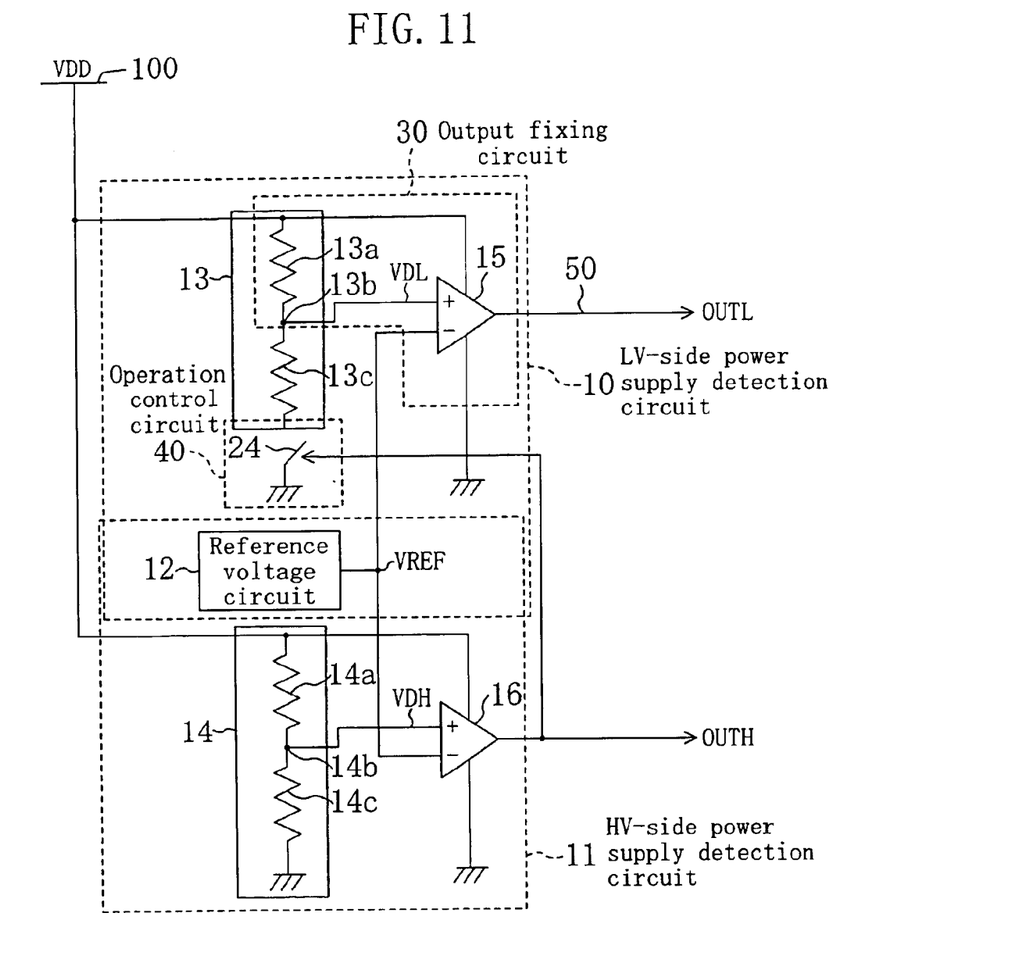
FIG. 11 shows a structure of a two-level supply voltage detection circuit according to embodiment 11 of the present invention.

FIG. 11 is a circuit diagram of a two-level supply voltage detection circuit of embodiment 11. In embodiment 11, the operation control circuit 40 of embodiment 7 shown in FIG. 7 includes a switch (third switch) 24 inserted between a ground terminal of the LV-side supply voltage divider circuit 13 and a ground power supply (i.e., between the resistor 13c and the ground power supply). The switch 24 is turned on when the HV-side detection signal OUTH is inactive. The switch 24 is turned off when the HV-side detection signal OUTH is active. The output fixing circuit 30 provided in embodiment 7 is omitted in embodiment 11. The output signal of the LV-side comparator circuit 15 of the LV-side power supply detection circuit 10 is directly output as the LV-side detection signal OUTL.

The operation of the two-level supply voltage detection circuit of embodiment 11 is now described. When voltage value VDD of the power supply 100 is lower than HV-side reference value VREFH, the HV-side detection signal OUTH is inactive, and accordingly, the switch 24 is turned on, so that the two-level supply voltage detection circuit operates as described in embodiment 7. That is, the electric current is consumed by the reference voltage circuit 12, the two supply voltage divider circuits 13 and 14, and the two comparator circuits 15 and 16.

When the power supply 100 is higher than HV-side reference value VREFH, the HV-side detection signal OUTH is active, and accordingly, the switch 24 is turned off, whereby the current consumption by the LV-side supply voltage divider circuit 13 is eliminated. As a result, the voltage at the voltage dividing point 13b of the LV-side supply voltage divider circuit 13 is pulled up to voltage VDD, so that the level of signal VDL is equal to voltage VDD of the power supply 100 and higher than reference voltage VREF of the reference voltage circuit 12. Thus, the output signal of the LV-side comparator circuit 15 becomes active. That is, the LV-side detection signal OUTL results in an active signal. Thus, for example, in a system including the above two-level supply voltage detection circuit of the present invention, an arithmetic processing unit and other circuits, when both of the output signals of the two-level supply voltage detection circuit, i.e., both the LV-side detection signal OUTL and the HV-side detection signal OUTH, are active, the current consumption by the LV-side supply voltage divider circuit 13 is eliminated during the operation of the system while the function of the two-level supply voltage detection circuit is maintained.

As described above, according to embodiment 11, the switch 24 of the operation control circuit 40 is inserted between the ground terminal of the LV-side supply voltage divider circuit 13 and the ground power supply. When the switch 24 is tuned off and the current consumption by the LV-side supply voltage divider circuit 13 is eliminated, the voltage at the voltage dividing point 13b of the LV-side supply voltage divider circuit 13 is pulled up to voltage VDD of the power supply 100, so that the LV-side detection signal OUTL output from the LV-side comparator circuit 15 is fixed to an active state. That is, the switch 24 which controls the operation of the LV-side power supply detection circuit 10 is provided at the above-described position, whereby the functions of the output fixing circuit 30, which have been described in embodiments 1 to 10, are achieved using the circuits included in the LV-side power supply detection circuit 10.

Thus, the independent output fixing circuit 30 used in embodiments 1 to 10 can be omitted while the function of the two-level supply voltage detection circuit is maintained. Accordingly, the layout area of the two-level supply voltage detection circuit can be reduced, and the current consumption by the two-level supply voltage detection circuit can also be reduced.

Furthermore, when the HV-side detection signal OUTH is active, the electric current flowing through the LV-side supply voltage divider circuit 13 is interrupted by the switch 24. Thus, the LV-side supply voltage divider circuit 13 may be formed by a resistor having a smaller resistance value by the amount of the saved power consumption as compared with the total resistance value of the HV-side supply voltage divider circuit 14 which is in operation all the time. As a result, the layout area of a resistive element can be reduced, and accordingly, the layout area of the entire two-level supply voltage detection circuit can be reduced.

In the case where the switch 24 is formed by an NMOS transistor, the source potential is equal to the ground potential, and thus, a large gate-source potential can be obtained. Accordingly, the drain-source resistance is small, and an error in the detection voltage is decreased.

What is claimed is:

1. A two-level supply voltage detection circuit, comprising:
a LV-side power supply detection circuit connected to a HV-side power supply, the LV-side power supply detection circuit outputting a first signal which is active when a voltage input from the HV-side power supply has a value equal to or higher than a LV-side reference value;
a HV-side power supply detection circuit connected to the HV-side power supply, the HV-side power supply detection circuit outputting a second signal which is active when a voltage input from the HV-side power supply has a value equal to or higher than a HV-side reference value that is higher than the LV-side reference value;
detection operation control means which receives the second signal from the HV-side power supply detection circuit and inactivates the operation of the LV-side power supply detection circuit when the second signal is active; and
LV-side power supply detection output fixing means which receives the second signal and outputs an active third signal as a signal corresponding to the first signal when the second signal is active.

2. A two-level supply voltage detection circuit according to claim 1, wherein the LV-side power supply detection output fixing means is a logic circuit which receives the first signal and the second signal and outputs an active third signal when at least one of the first signal and the second signal is active.

3. A two-level supply voltage detection circuit according to claim 1, wherein:
the LV-side power supply detection output fixing means includes a resistor and a first switch which are connected in series between a signal output terminal of the LV-side power supply detection circuit and the HV-side power supply; and
the first switch receives the second signal and is turned on only when the second signal is active.

4. A two-level supply voltage detection circuit according to claim 1, wherein:
the detection operation control means includes a second switch inserted between the HV-side power supply and the LV-side power supply detection circuit; and
the second switch receives the second signal and is turned on only when the second signal is inactive.

5. A two-level supply voltage detection circuit according to claim 1, wherein:
the detection operation control means includes a second switch inserted between a LV-side power supply and the LV-side power supply detection circuit; and
the second switch receives the second signal and is turned on only when the second signal is inactive.

6. A two-level supply voltage detection circuit according to claim 1, wherein:
the LV-side power supply detection circuit includes
a reference voltage circuit for outputting a signal having a constant voltage regardless of the voltage of the HV-side power supply,
a LV-side supply voltage divider circuit for dividing the voltage of the HV-side power supply and outputting the divided voltage, and
a LV-side comparator circuit which receives the output signal from the reference voltage circuit and an output signal from a voltage dividing point of the LV-side supply voltage divider circuit and outputs a first signal which is active only when the level of the output signal from the voltage dividing point of the LV-side supply voltage divider circuit is higher than the level of the output signal from the reference voltage circuit;
the HV-side power supply detection circuit includes
a HV-side supply voltage divider circuit for dividing the voltage of the HV-side power supply at a dividing ratio such that the HV-side supply voltage divider circuit outputs a voltage lower than the output voltage of the LV-side supply voltage divider circuit, and
a HV-side comparator circuit which receives the output signal from the reference voltage circuit and an output signal from a voltage dividing point of the HV-side supply voltage divider circuit and outputs a second signal which is active only when the level of the output signal from the voltage dividing point of the HV-side supply voltage divider circuit is higher than the level of the output signal from the reference voltage circuit; and
the detection operation control means inactivates at least one of the LV-side supply voltage divider circuit and the LV-side comparator circuit when the second signal is active.

7. A two-level supply voltage detection circuit according to claim 6, wherein:
the detection operation control means includes a second switch inserted between the HV-side power supply and the LV-side power supply detection circuit; and
the second switch receives the second signal and is turned on only when the second signal is inactive.

8. A two-level supply voltage detection circuit according to claim 6, wherein:
the detection operation control means includes a second switch inserted between the LV-side power supply and the LV-side power supply detection circuit; and
the second switch receives the second signal and is turned on only when the second signal is inactive.

9. A two-level supply voltage detection circuit according to claim 6, wherein:
the LV-side supply voltage divider circuit includes a first group of resistors provided between the HV-side power supply and the LV-side power supply; and
the HV-side supply voltage divider circuit includes a second group of resistors provided between the HV-side power supply and the LV-side power supply.

10. A two-level supply voltage detection circuit according to claim 9, wherein the total resistance value of the first resistor group is smaller than that of the second resistor group.

11. A two-level supply voltage detection circuit according to claim 9, wherein
the detection operation control means includes a third switch inserted between the first resistor group of the LV-side supply voltage divider circuit and the LV-side power supply; and
the third switch receives the second signal and is turned on only when the second signal is inactive.

12. A two-level supply voltage detection circuit according to claim 11, wherein the total resistance value of the first resistor group is smaller than that of the second resistor group.

13. A two-level supply voltage detection circuit according to claim 11, wherein the third switch is an NMOS transistor.

* * * * *